(12) United States Patent
Hachuda

(10) Patent No.: US 10,797,423 B2
(45) Date of Patent: Oct. 6, 2020

(54) ELECTRIC CONTACT AND SOCKET FOR ELECTRIC COMPONENT

(71) Applicant: ENPLAS CORPORATION, Kawaguchi-shi, Saitama (JP)

(72) Inventor: Osamu Hachuda, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 16/470,891

(22) PCT Filed: Dec. 22, 2017

(86) PCT No.: PCT/JP2017/046158
§ 371 (c)(1),
(2) Date: Jun. 18, 2019

(87) PCT Pub. No.: WO2018/123877
PCT Pub. Date: Jul. 5, 2018

(65) Prior Publication Data
US 2020/0091644 A1 Mar. 19, 2020

(30) Foreign Application Priority Data
Dec. 27, 2016 (JP) .................. 2016-254010

(51) Int. Cl.
*H01R 13/24* (2006.01)
*G01R 1/04* (2006.01)
(Continued)

(52) U.S. Cl.
CPC ....... *H01R 13/2428* (2013.01); *G01R 1/0441* (2013.01); *G01R 31/2863* (2013.01);
(Continued)

(58) Field of Classification Search
CPC .... H01R 13/2428; H01R 13/22; H01R 13/24; H01R 13/2407; G01R 1/0441
(Continued)

(56) References Cited

U.S. PATENT DOCUMENTS 6,323,667 B1 * 11/2001 Kazama ............. G01R 1/06722
324/755.05
7,057,403 B2 * 6/2006 Kazama ............. G01R 1/06722
324/755.05
(Continued)

FOREIGN PATENT DOCUMENTS

JP  2002-31648   1/2002
JP  2013-53931   3/2013
(Continued)

OTHER PUBLICATIONS

International Search Report dated Mar. 20, 2018, in corresponding International Patent Application No. PCT/JP2017/046158.
(Continued)

*Primary Examiner* — Peter G Leigh
(74) *Attorney, Agent, or Firm* — Staas & Halsey LLP

(57) ABSTRACT

An electric contact including a first member portion to be in contact with a first electric component and a second member portion to be in contact with a second electric component. The first member portion is formed to be tubular by an electrically conductive material plate member a part of which is formed of wave shape portions, and the first member portion includes a first contact portion to be in contact with the first electric component and a spring portion formed by the wave shape portions. The second member portion is constructed by a rod member and includes a second contact portion to be in contact with the second electric component and an insert portion inserted into the spring portion. The first and second contact portions are urged to separate each other while the first and second
(Continued)

member portions are contracted with against urging force of the spring portion.

8 Claims, 11 Drawing Sheets

(51) Int. Cl.
    *G01R 31/28*     (2006.01)
    *H01R 12/73*     (2011.01)
    *H01R 13/04*     (2006.01)
    *H01R 33/76*     (2006.01)

(52) U.S. Cl.
    CPC ............. *H01R 12/73* (2013.01); *H01R 13/04* (2013.01); *H01R 33/76* (2013.01)

(58) Field of Classification Search
    USPC ........................................................ 439/289
    See application file for complete search history.

(56) References Cited

U.S. PATENT DOCUMENTS

| | | | | |
|---|---|---|---|---|
| 7,677,901 | B1* | 3/2010 | Suzuki ................. | G01R 1/0466 439/66 |
| 7,969,170 | B2* | 6/2011 | Kazama ............. | G01R 1/06772 324/754.01 |
| 2008/0100325 | A1* | 5/2008 | Sinclair ................ | G01R 1/0483 324/755.05 |
| 2010/0123476 | A1* | 5/2010 | Kazama ............. | G01R 1/06722 324/755.01 |
| 2012/0019277 | A1* | 1/2012 | Kazama .................. | F16F 1/021 324/755.05 |
| 2013/0099814 | A1* | 4/2013 | Kazama ............. | G01R 1/06722 324/755.05 |
| 2014/0162503 | A1* | 6/2014 | Yamada ................ | H01R 4/4863 439/786 |
| 2014/0253163 | A1* | 9/2014 | Suzuki ............... | G01R 1/06722 324/755.05 |
| 2015/0369859 | A1* | 12/2015 | Suzuki ............... | G01R 1/06722 324/755.08 |
| 2015/0377925 | A1* | 12/2015 | Hwang ............. | G01R 1/06738 324/755.05 |

FOREIGN PATENT DOCUMENTS

| | | |
|---|---|---|
| JP | 2014-169887 | 9/2014 |
| JP | 2015-38455 | 2/2015 |
| JP | 2016-507751 | 3/2016 |

OTHER PUBLICATIONS

Written Opinion of the International Searching Authority dated Mar. 20, 2018, in corresponding International Patent Application No. PCT/JP2017/046158.

* cited by examiner

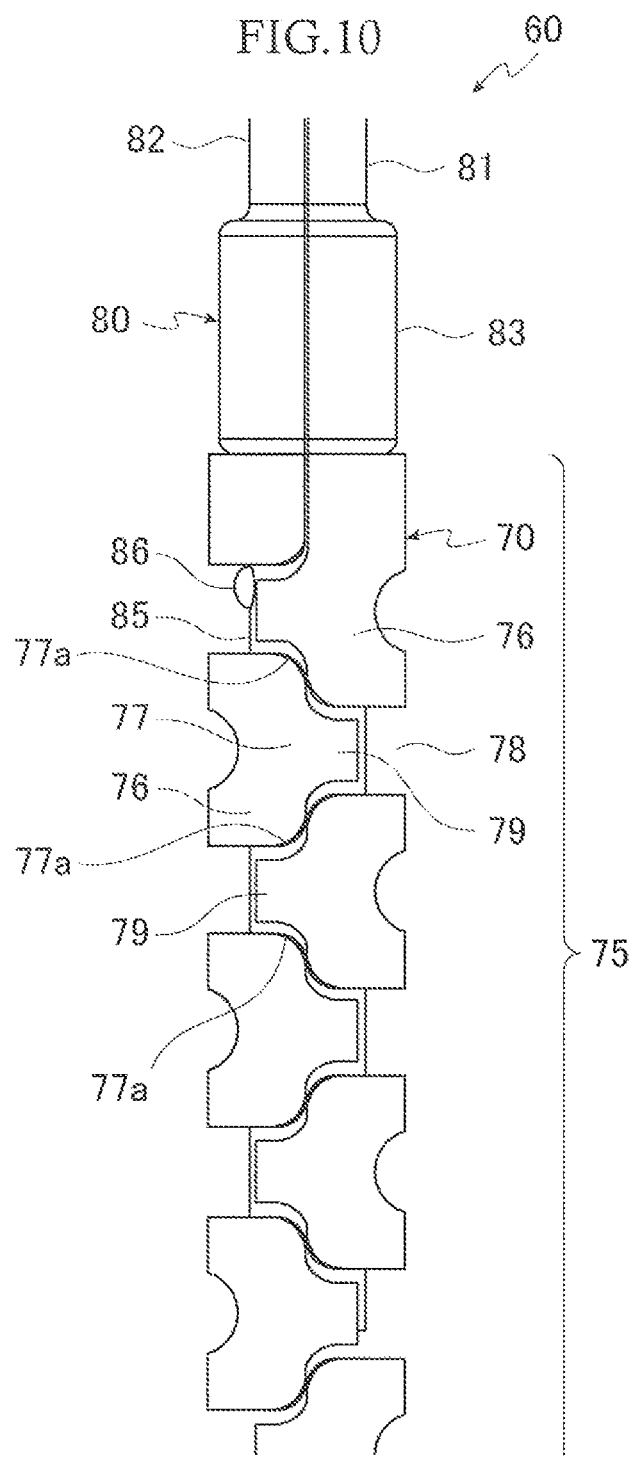

ELECTRIC CONTACT AND SOCKET FOR ELECTRIC COMPONENT

CROSS-REFERENCE TO RELATED APPLICATION

This application is a U.S. National Stage Application which claims the benefit under 35 U.S.C. § 371 of PCT International Patent Application No. PCT/JP2017/046158, filed, Dec. 22, 2017, which claims the foreign priority benefit under 35 U.S.C. § 119 of Japanese Patent Application No. 2016-254010, filed Dec. 27, 2016, the contents of which are incorporated herein by reference.

TECHNICAL FIELD

The present invention relates to an electric contact to be electrically connected to an electric component such as a semiconductor device (hereinafter referred to as "IC package"), and a socket for electric component having the electric contact disposed therein.

BACKGROUND ART

A contact pin disposed in an IC socket serving as the socket for electric component has been conventionally known as the electric contact of type as described above. The IC socket is configured to be disposed on a wiring board for accommodating the IC package to be inspected. Terminals of the IC package and electrodes of the wiring board are electrically connected to each other via the contact pins so that the test such as a continuity test is conducted.

There has been known such electric contact which has a contact portion for contacting a wiring board, a contact portion for contacting an IC socket and a spring portion for urging these contact portions in the separating direction each other, and these contact portions and the spring portion are integrally constructed by bending a plate member and are arranged within a pipe member formed by bending a plate member (for example, refer to Patent Literature 1).

CITATION LIST

Patent Literature

Patent Literature 1: Japanese Patent Laid open 2002-31648

SUMMARY OF INVENTION

Technical Problem

In a contact pin like disclosed in Patent Literature 1, it has been required that a number of parts is reduced and electric resistance value of a contact pin is lowered.

An object of the present invention is to provide an electric contact (contact pin) and a socket for electric component (IC package) which is capable to reduce a number of parts of electric contact (contact pin), and is capable to lower electric resistance value of a socket for electric component (IC package) when the socket for electric component (IC package) electrically connects a first electric component (wiring board) and a second electric component (IC package).

Solution to Problem

In order to solve the problem, the present invention according to claim 1 provides an electric contact to be disposed between a first electric component and a second electric component to establish electric connection therebetween, comprising:

a first member portion to be in contact with the first electric component and a second member portion to be in contact with the second electric component, the first member portion and the second member portion being provided to be extendable and contractible with respect to one another, wherein the first member portion is formed to be tubular from an electrically conductive material plate member a part of which is formed of wave shape portions, and the first member portion includes a first contact portion to be in contact with the first electric component and a spring portion formed by the wave shape portions, the second member portion is constituted by a rod member and includes a second contact portion to be in contact with the second electric component and an insert portion which is inserted into the spring portion, and the first contact portion and the second contact portion are urged to separate each other while the first member portion and the second member portion are contracted with against urging force of the spring portion.

In the present invention of claim 2 is, in addition to the invention according to claim 1, the insert portion inserted into the spring portion contacts the first contact portion so that the first member portion and the second member portion are electrically conducted.

The present invention according to claim 3 provides a socket for electric component comprising: a socket body which is to be disposed on a first electric component, and includes a housing portion to accommodate a second electric component, and the electric contact according to claim 1 or 2, which is disposed in the socket body, and to be in contact a terminal of the first electric component, and a terminal of the second electric component.

Advantageous Effects of Invention

According to the present invention of claim 1, the electric contact is formed by two parts of the first member portion and the second member portion, thereby the number of parts can be reduced. Further, the insert portion of the second member portion is inserted into the spring portion of the first member portion and the first member portion and the second member portion are electrically connected, thereby the distance of the electric current passing from the first contact portion to the second contact portion can be shortened than a conventional electric contact in which the electric current passes through the whole of the spring portion and reaches to the second electric component from the first electric component. As a result, the electric resistance value of the socket for electric component can be lowered.

According to the present invention of claim 2, the insert portion inserted into the spring portion contacts the first contact portion, thereby the passing distance of the electric current can be shortened than a case in which the insert portion contacts only the spring portion. As a result, the electric resistance value of the socket for electric component can be further lowered.

The present invention according to claim 3, the socket for electric component comprises the electric contact according to claim 1 or 2, thereby the number of parts of the socket for electric component can be decreased. Further, the socket for electric component comprises the electric contact according to claim 1 or 2, thereby the distance of the electric current passing from the first electric component contacting the first contact portion to the second electric component contacting the second contact portion can be shortened than a conventional socket for electric component and the electric resistance value of electric contacts can be lowered.

BRIEF DESCRIPTION OF DRAWING

FIG. 10 is an enlarged plan view of a part of FIG. 6 illustrating the contact pin of the IC socket according to Embodiment of the present invention.

Embodiment of the present invention is described below.

Embodiment of the present invention is illustrated in FIG. 1~FIG. 11.

Figure 1:
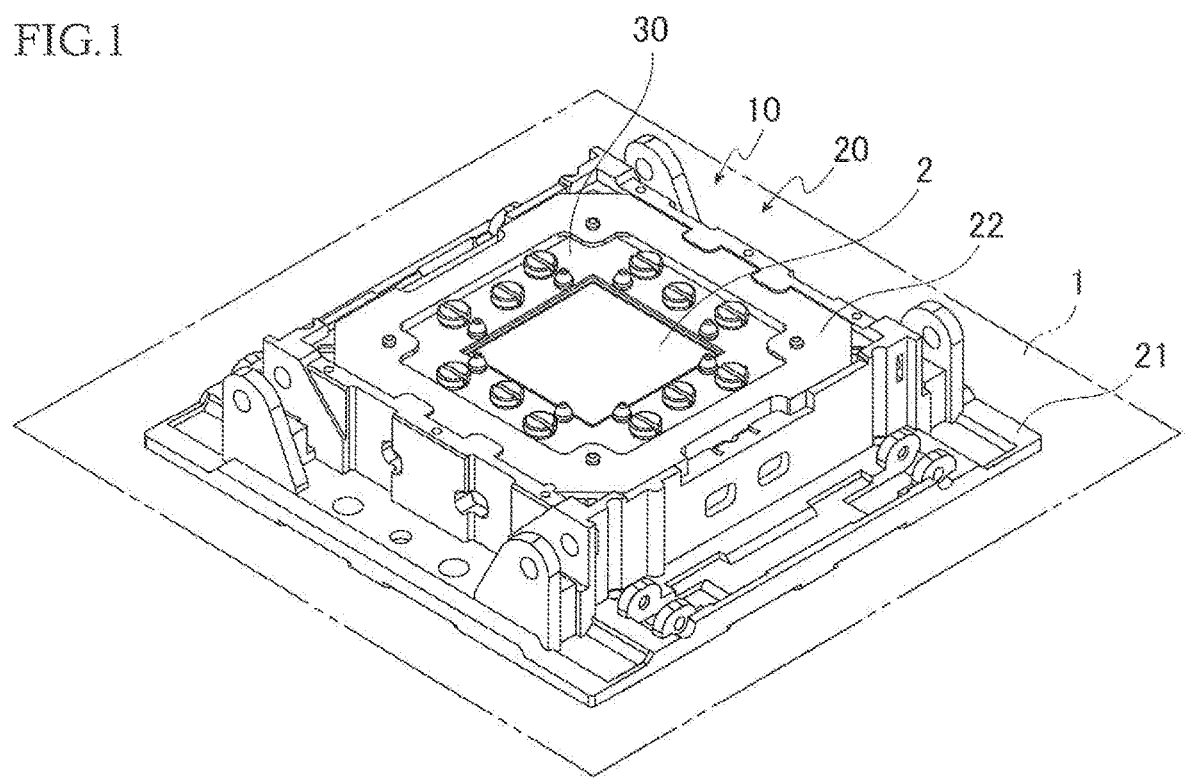
FIG. 1 is a perspective view illustrating a socket body of the IC socket according to Embodiment of the present invention.
Figure 4:
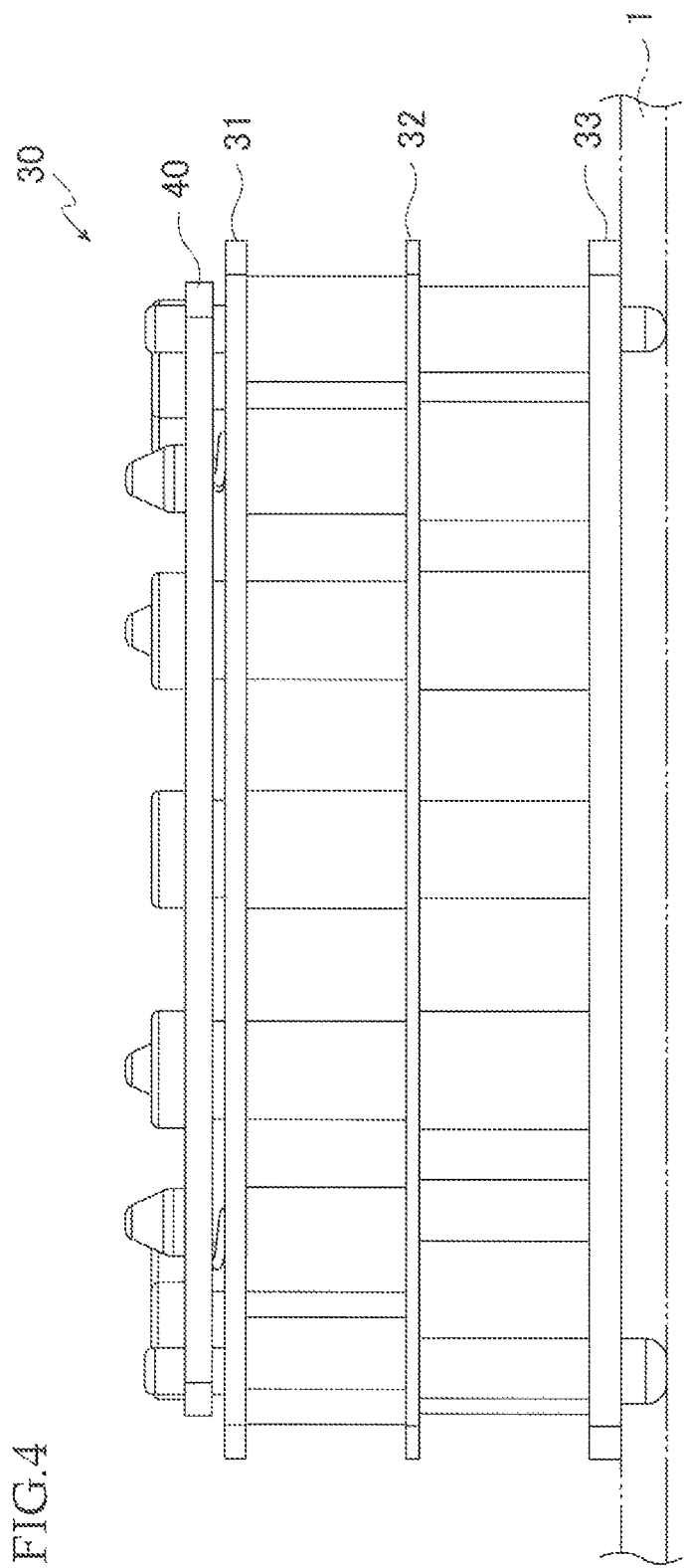
FIG. 4 is a plan view illustrating a contact module of the socket body of the IC socket according to Embodiment of the present invention.
Figure 5:
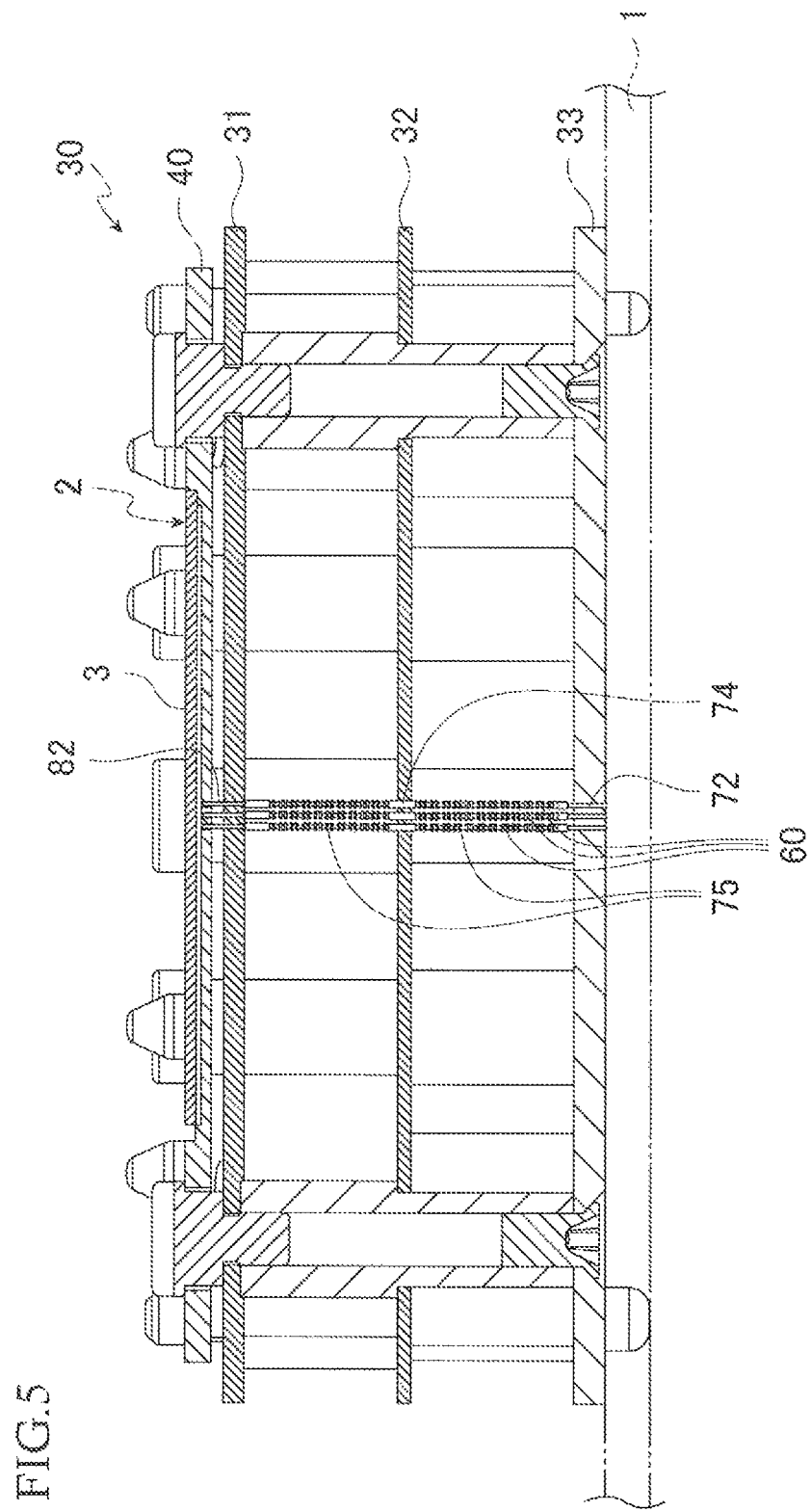
FIG. 5 is a longitudinal cross-sectional view illustrating the contact module of the IC socket according to Embodiment of the present invention.
Figure 6:
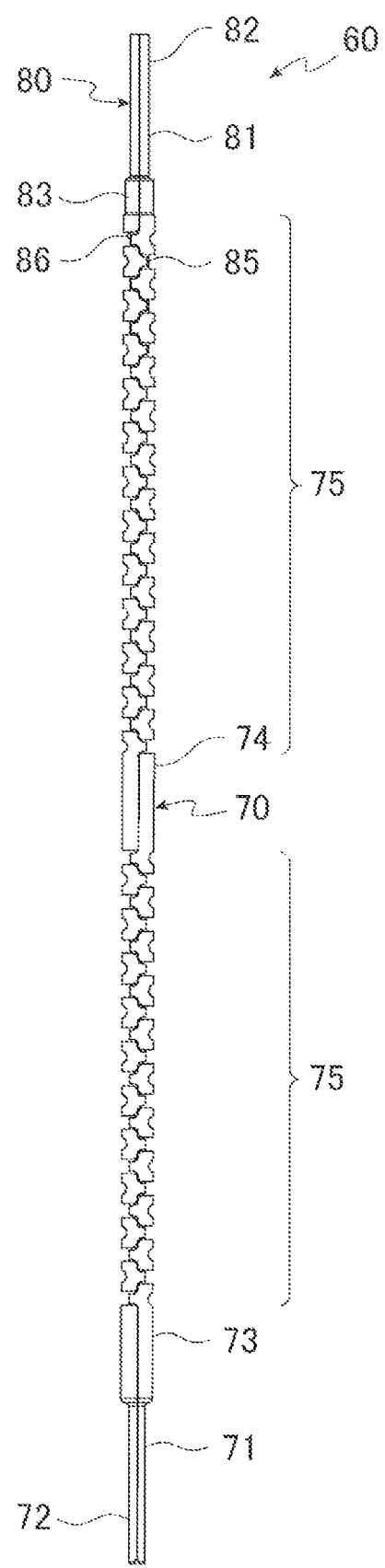
FIG. 6 is a front view illustrating a contact pin of the IC socket according to Embodiment of the present invention.
Figure 7:
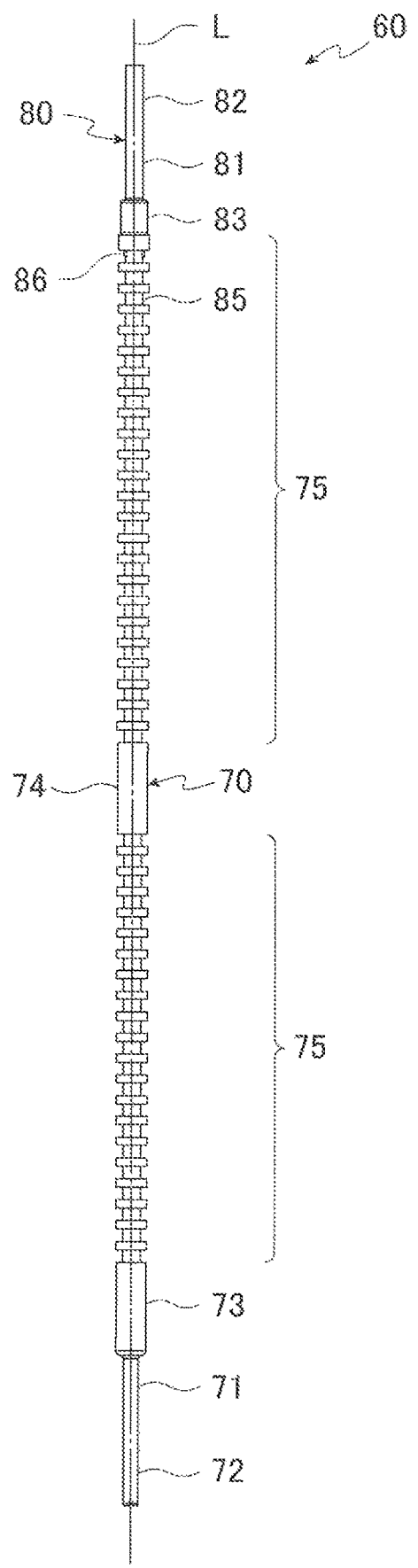
FIG. 7 is a back view illustrating the contact pin of the IC socket according to Embodiment of the present invention.
Figure 8:
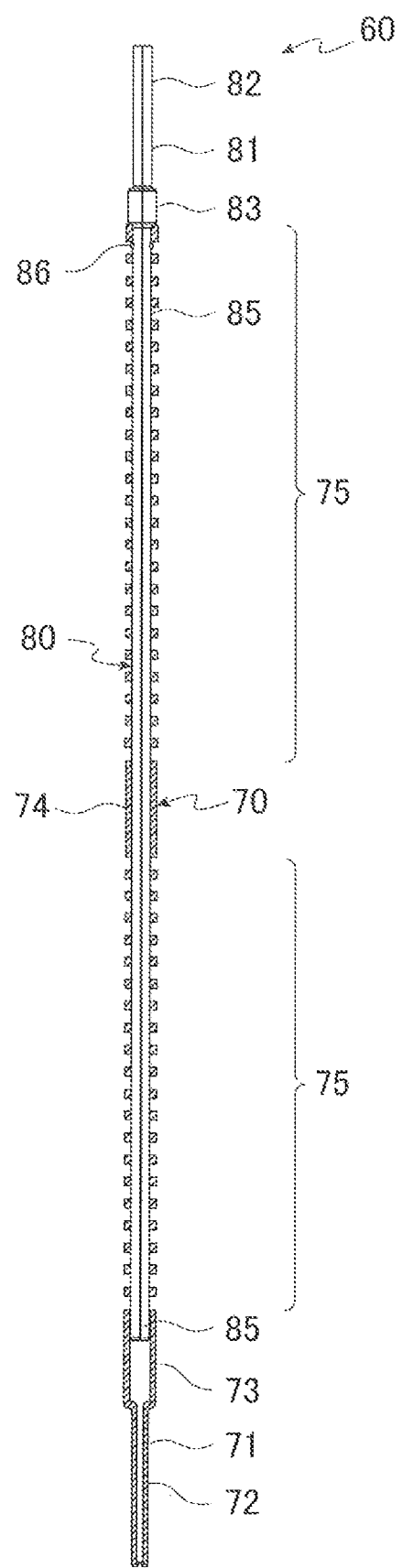
FIG. 8 is a longitudinal cross-sectional view illustrating the contact pin of the IC socket according to Embodiment of the present invention.
Figure 9:
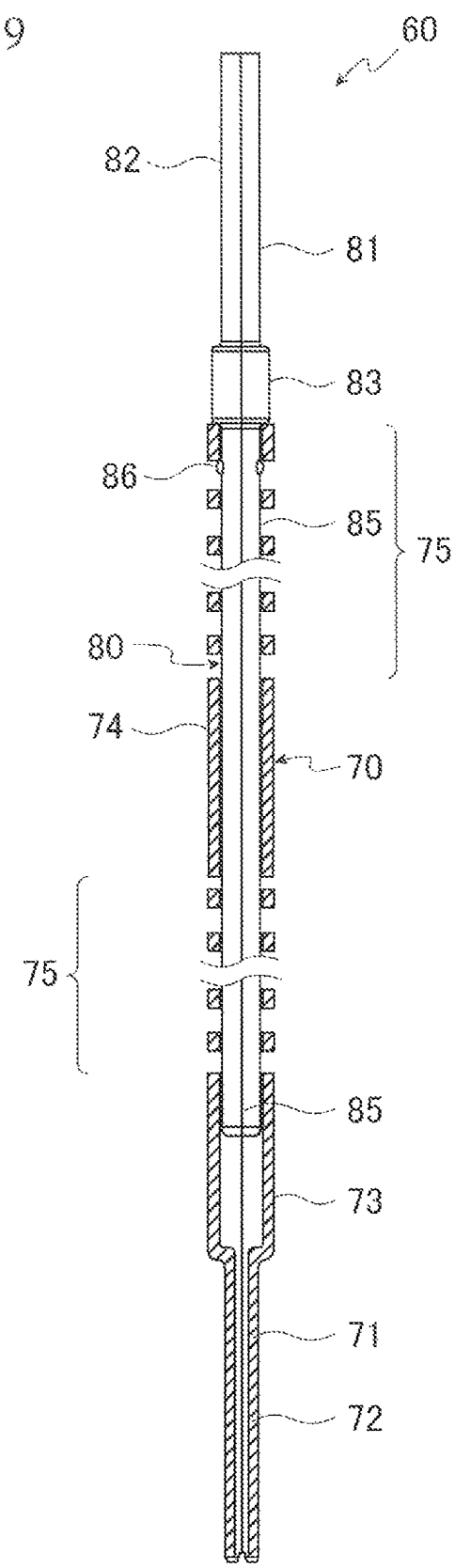
FIG. 9 is an enlarged longitudinal cross-sectional view of a part of FIG. 8 illustrating the contact pin of the IC socket according to Embodiment of the present invention.

As illustrated in FIG. 1, FIG. 4 and FIG. 5, an IC socket 10 as a "socket for electric component" according to Embodiment is configured to be disposed on a wiring board 1 as a "first electric component", accommodate an IC package 2 as a "second electric component" on an upper surface, and come into contact with an electrode (not shown) as a "terminal" of the wiring board 1 and a solder ball (not shown) as a "terminal" of the IC package 2 for electrically connecting those terminals. The IC package 10 is used as a testing device for the continuity test such as burn-in testing to the IC package 2, for example.

The IC package 2 (see FIG. 5) of Embodiment has a plurality of spherical solder balls arranged in a matrix in a substantially quadrangular prescribed range on a lower surface of a substantially quadrangular package body 3.

As shown in FIG. 1, the IC socket 10 includes a socket body 20 configured to be disposed on the wiring board 1 and accommodate the IC package 2, a pair of cover members (not shown) which rotate with respect to the socket body 20 so as to be opened and closed, and an operation member having a frame shape (not shown) for rotating operations of the cover members. Detailed explanations of the cover members and the operation member will be omitted.

Figure 2:
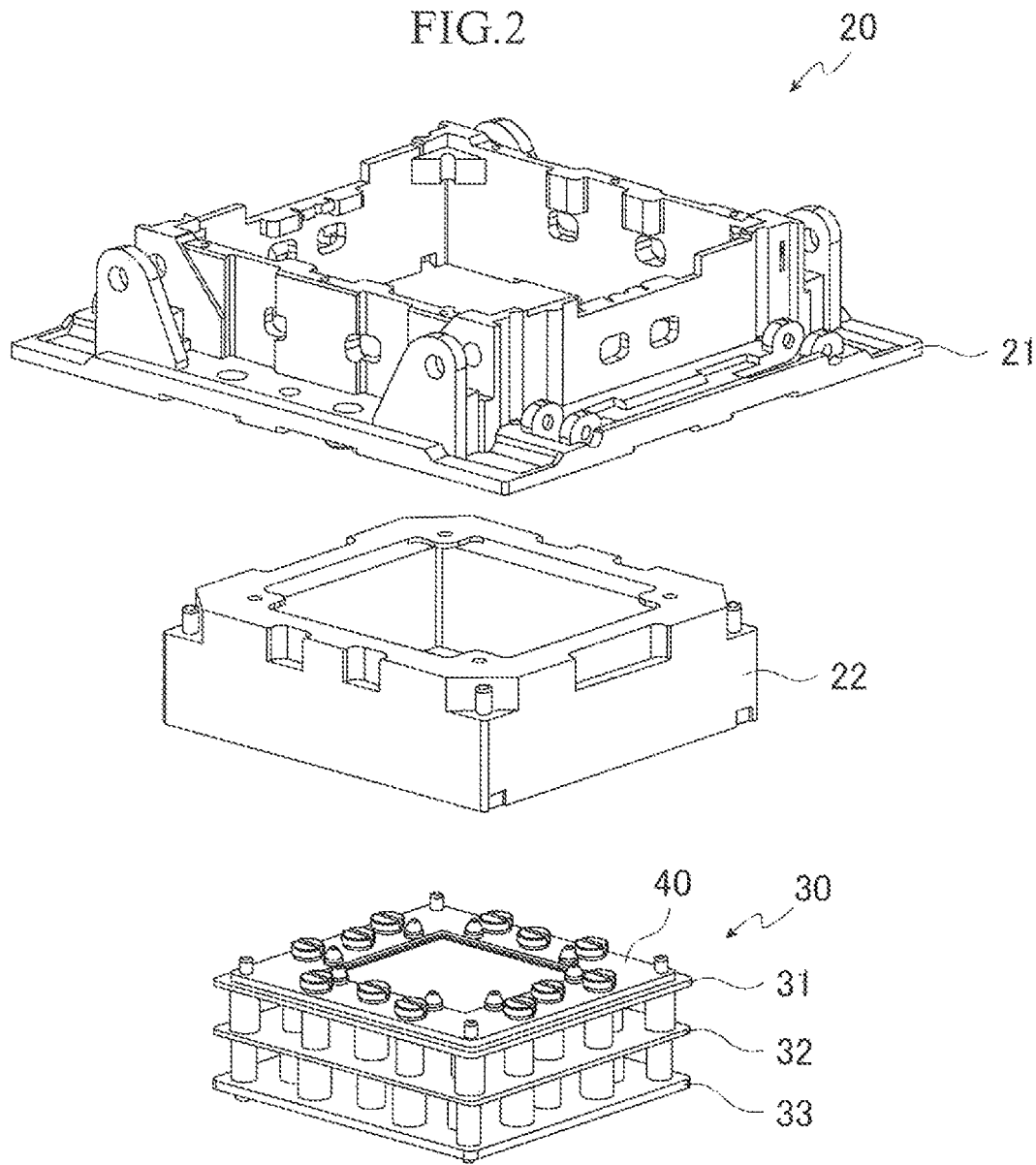
FIG. 2 is an exploded perspective view illustrating the socket body of the IC socket according to Embodiment of the present invention.
Figure 3:
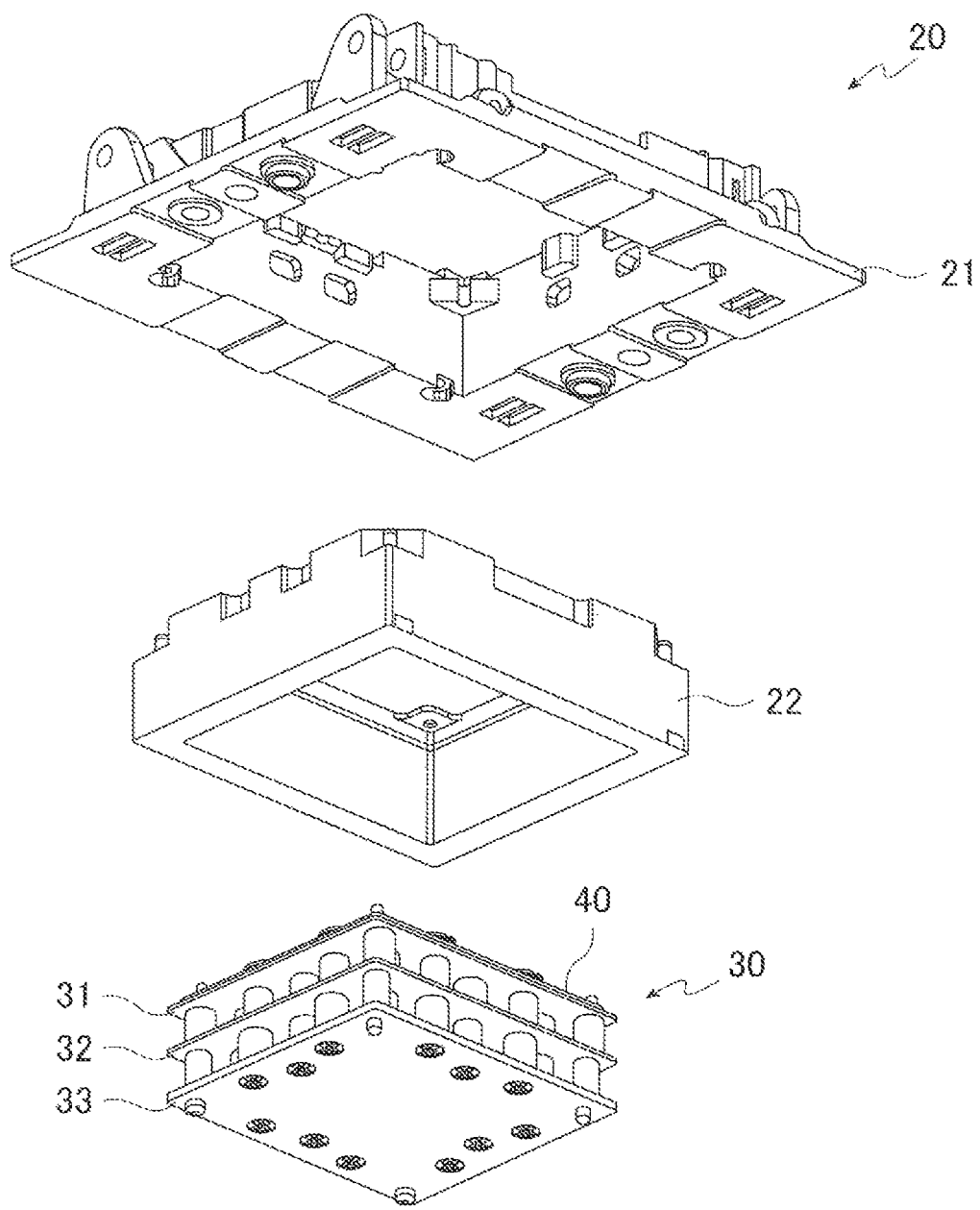
FIG. 3 is an exploded perspective view taken from other angle illustrating the socket body of the IC socket according to Embodiment of the present invention.

As shown in FIG. 2 and FIG. 3, the socket body 20 is formed by disposing a frame member 22 with quadrangle frame shape in a support member 21 which is formed into a quadrangle frame shape for supporting the cover members and the operation member, and further disposing a contact module 30 in the frame member 22. The contact module 30 has a plurality of contact pins 60 (see FIG. 5 and the like) as "contact module" arranged in a matrix, and a floating plate 40 as a "housing portion" at the upper surface side for accommodating the IC package 2.

As shown in FIG. 4 and FIG. 5, the contact module 30 includes an upper holding member 31, a center holding member 32, a lower holding member 33 and the floating member 40 and the like. The upper holding member 31, the center holding member 32 and the lower holding member 33 are held at predetermined intervals, respectively. The floating member 40 located above the upper holding member 31 is urged in an upward direction of the socket body 20 by a spring (not shown) in upward direction of the socket body 20 so as to be vertically movable with respect to the upper holding member 31, the center holding member 32, and the lower holding member 33 which are held at the predetermined intervals.

The contact pins 60 are inserted through holes (not shown) which vertically penetrate through the upper holding member 31, the center holding member 32, the lower holding member 33 and the floating member 40, and the contact pins 60 are formed to be vertically extendable and contractible. In Embodiment, the contact pins 60 are arranged in a matrix with respect to the contact module 30 as described above. However, FIG. 5 conveniently shows only three contact pins 60.

As shown in FIG. 6~FIG. 10, each of the contact pins 60 is constituted by two member portions which are a first member portion 70 formed in an electric conductive cylindrical shape and being to be in contact with an electrode of the wiring board, and a second member portion 80 formed in an electric conductive rod shape (here, hollow rod) and being to be in contact with a solder ball of the IC package 2.

The first member portion 70 is formed in a tubular shape along an axis L and has a first contact portion 71 and a spring portion 75 which is linked to the first contact portion 71 and urges to separate the first contact 71 of the first member portion 70 and a second contact 81 of a second member portion 80 described later along the L axis. The first contact 71 has a first tip portion 72 configured to contact the wiring board 1 located below and having a small diameter and an inserted portion 73 linking to the upper side portion of the first tip portion 72 and having a larger diameter. The inner portion of the inserted portion 73 has a size and a shape so that an insert portion 85 of the second member portion 80 described later is slidablly inserted into.

The spring portion 75 includes the wave shape portions 76 continuously formed while alternately extending from the both sides of the axis L in the longitudinal direction from the first contact portion 71 to the spring portion 75 by an equal distance in the direction orthogonal to the axis L. The wave shape portions 76 are curved or bent to be tubular. As a result, the convex portions 77 of the wave shape portions 76 are positioned alternately and continuously on one side and other side of the axis L. Further, the convex portion 77 of the wave shape portion 76 formed in a half-cylindrical shape and protruding to one side from the axis L is confronting to the recess portion 78 of the wave shape portion 76 formed in a half-cylindrical shape and protruding to other side from the axis L.

As shown in FIG. 10, a protrusion portion 79 protruded to the direction orthogonal to the axis L is formed at the top of the convex portion 77 of each of the wave shape portions 76. The protrusion portion 79 is formed to enter into the confronting recess portion 78. As a result that the protrusion portion 79 enters into the recess portion 78, when the force is applied in the direction for contracting the spring portion 75 along the axis L against the urging force, the protrusion 79 is brought into abutment on the side walls 77a of the respective convex portion 77 at both sides of the recess portion 78 into which the protrusion 79 has entered by a predetermined contracting amount. By means of this, the applied stopper force prevents further contraction of the spring portion 75. As a result, the spring portion 75 no longer contracts in excess of the predetermined contracting amount. This makes it possible to prevent failure of plastic deformation of the spring portion 75 to the level over the elastically deformable range.

The first member portion 70 has a non-spring middle portion 74 at the substantially middle position and the spring portion 75 is divided into two parts by the middle portion 74.

Figure 11A:
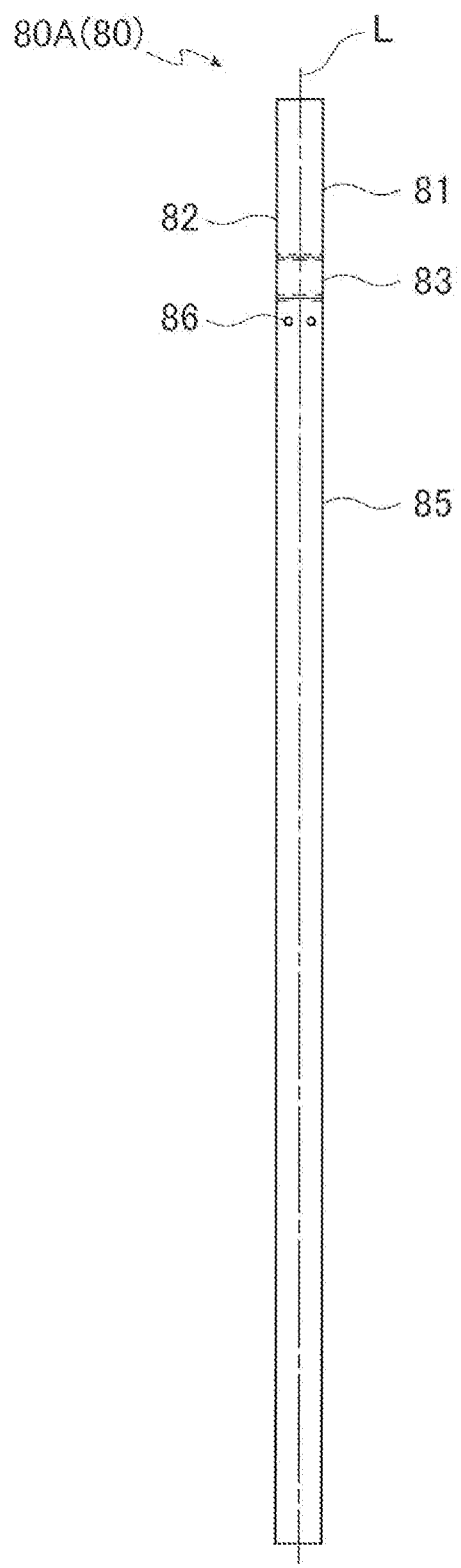
FIGS. 11A and 11B are development views illustrating the contact pin of the IC socket according to Embodiment of the present invention.
Figure 11B:
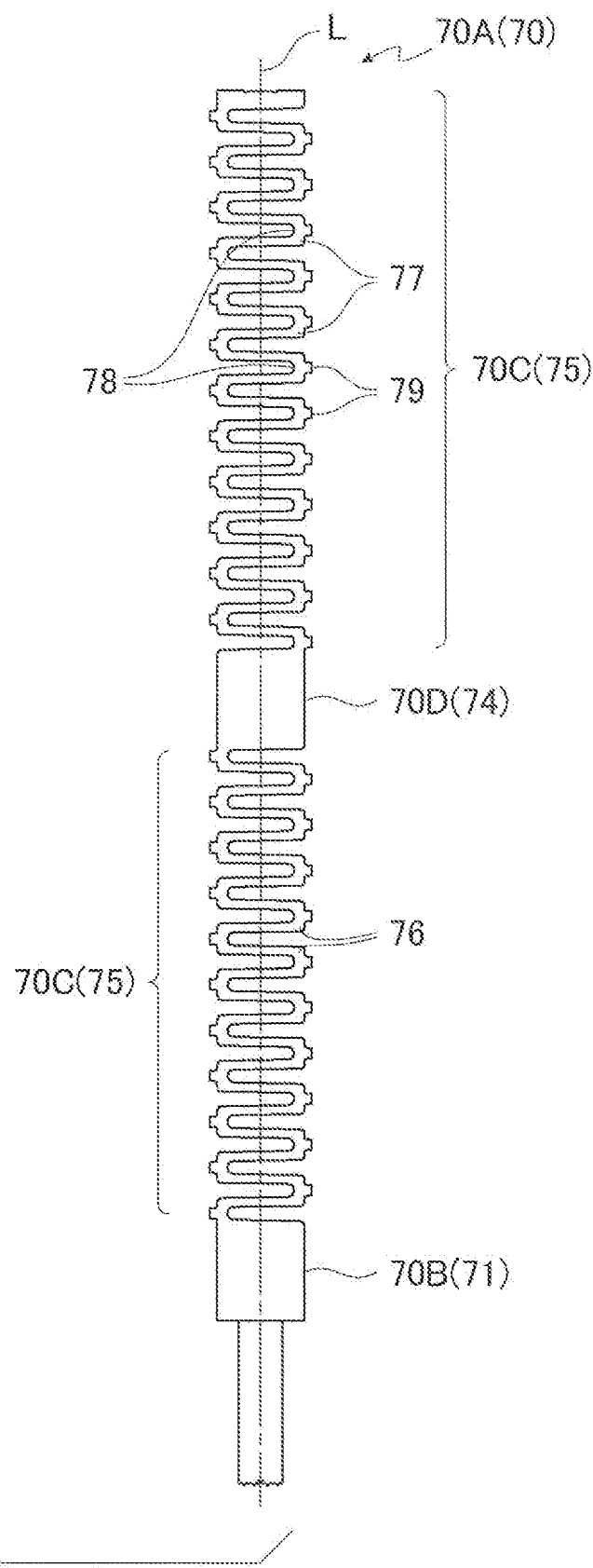

The first member portion 70 is formed from a first electric conductive material member 70A shown in FIG. 11. The first electric conductive material member 70A is constituted from a plate shape member, and a wave shape part 70C is partly formed on the plate shape member 70B. Here, the plate shape member 70B is formed at one end side and the wave shape part 70C is formed at other end side linking to the plate shape member 70B. At the substantially middle position of the wave shape part 70C, other plate shape member 70D is formed.

The plate shape member 70B is curved or bent in a tubular shape along the axis L heading toward the longitudinal direction from the plate shape member 70B to the wave shape part 70C, and the first contact portion 71 is formed in a tubular shape. The wave shape part 70C is curved or bent in a tubular shape, and the spring portion 75 continuous with the first contact portion 71 is formed in a tubular shape. The other plate member 70D is curved or bent in a tubular shape along the axis L, and the middle portion 74 is formed in a tubular shape at the substantially middle position of the spring portion 75. As a result, the first member portion 70 which is divided to two by the first contact portion 71 and the middle portion 74 is constituted.

The second member portion 80 is formed in a rod shape along the axis L, and here it is formed as a hollow rod shape. The second member portion 80 may be formed in a solid rod shape. The second member portion 80 has a second contact portion 81 and an insert portion 85 continuous with the second contact portion 81. The second contact portion 81 contacts the IC package 2 located upward and has a second tip portion 82 with a small diameter and a locking portion 83 with a larger diameter continuous with the lower side of the second tip portion 82. The locking portion 83 has a larger diameter than that of the spring portion 75 so as to bring the abutment of the end portion of the spring portion 75.

The insert portion 85 has a smaller diameter than that of the locking portion 83 of the second contact portion 81 and is inserted in the spring portion 75 of the first member portion 70, and the insert portion 85 has a size and a shape so that the insert portion 85 can be slidable and inserted into the inserted portion 73 of the first contact portion 71 of the first member portion 81. The length of the insert portion 85 is determined so that the insert portion 85 is inserted in the inserted portion 73 of the first contact portion 71 at the state that a force in the contracting direction is not applied to the insert portion 85 inserted in the spring portion 75, and further so that the end portion of the insert portion 85 does not reach the boundary portion between the inserted portion 73 and the first tip portion 72 when the spring portion 75 is contracted in the contracting direction and a stopper by the protrusion portion 79 is operated.

Projections 86 projected by a predetermined amount are formed on the wall around the locking portion 83 of the second contact portion 81 of the insert portion 85. In the case, the projections 86 in a hemisphere shape are disposed at two opposing points, respectively on the wall surface at the same positions in the direction of the axis L of the insert portion 85. This makes it possible to hold the spring portion 75 in abutment on the lock portion 83 so as not to be detached therefrom.

The second member portion 80 is formed from a second electric conductive material member 80A shown in FIG. 11. The second electric conductive material member 80A is constituted from a slender plate shape member. The second electric conductive material member 80A is curved or bent in a tubular shape along the axis L in the longitudinal direction and only a halfway part portion (a part corresponding to the locking portion 83) is curved or bent in a tubular shape with a larger diameter, and the second contact portion 81 in a tubular shape having the second tip portion 82 and the locking portion 83 is formed and the insert portion 85 in a tubular shape continuous with the second contact portion 81 is formed. As a result, the second member portion 80 having the second contact portion 81 and the insert portion 85 is constituted.

The contact pin 60 formed like above is configured to have the first tip portion 72 having the small diameter of the first member portion 70 inserted into the through hole of the lower holding member 33 of the contact module 30 and projected out below the lower holding member 33. The second tip portion 82 having the small diameter of the second contact portion 81 of the second member portion 80 is inserted into the through hole of the floating plate 40. The middle portion 74 positioned at the substantially middle position of the spring portion 75 of the first member portion 70 is inserted into the through hole of the middle holding member 32 of the contact module 30. In this manner, the contact pin 60 is held in the contact module 30.

Function of the IC socket 10 provided with the contact pin 60 each constituted by the first member portion 70 and the second member portion 80 will be described below.

The IC socket 10 is used in the state that each of the contact pins 60 is installed in the contact module 30 of the socket body 20 to allow that the first tip portion 72 of the first contact portion 71 of the first member portion 70 is projected out below the lower holding member 33 and also the second tip portion 82 of the second contact 81 of the second member portion 80 is inserted through the floating plate 40 and the middle portion 74 of the first member portion 70 is arranged with inserted into the middle holding member 32.

The IC socket 10 is positioned and fixed on the wiring board 1 so that the first tip portion 72 of the first contact portion is brought into contact with the electrode of the wiring board 1. At this time, the first tip portion 72 is pushed upward by the wiring board 1, thereby the first member portion 70 is wholly pushed upward and the second member portion 80 is also pushed upward through the locking portion 83 of the second contact portion 81 of the second member portion 80 on which the end part of the spring portion 83 has abutted.

Thereafter, the IC package 2 is housed on the floating plate 40 and the solder ball is brought into contact with the second tip portion 82 of the second contact portion 81. At this state, the operation member is operated and the IC package 2 is pressed downward by the cover member, and the floating plate 40 is descended downward together with the IC package 2 with against the upward urging force, and the second tip portion 82 is pressed by the soldier ball and the second member portion 80 is pressed downward with against the urging force of the spring portion 75. Thus, the spring portion 75 is compressed, and the first contact portion 71 of the first member portion 70 and the second contact portion 81 of the second member portion 80 are urged to separate each other and are made contact the electrode of the wiring board 1 and the solder ball of the IC package 2 at an adequate contact pressure to electrically connect these, and at this state the continuity test such as a burn-in test or the like is performed.

At this time, the insert portion 85 of the second member portion 80 is slidablly inserted into the inserted portion 73 of the first contact portion 71 of the first member portion 70, thereby the electrode of the wiring board 1 and the solder ball of the IC package 2 can be electrically connected in the short distance through the second contact portion 81 of the second member portion 80, the insert portion 85, the inserted portion 73 of the first member portion 70 and the first contact portion 71. This makes it possible to establish electric connection between the electrode of the wiring board 1 and the solder ball of the IC package 2 with the low electric resistance value.

The protrusion portion 79 is entered into the recess portion 78, thereby when the force is applied in the direction for contracting the spring portion 75 along the axis L against the urging force, the protrusion 79 is brought into abutment on the side walls 77a of the respective convex portion 77 at both sides of the recess portion 78 into which the protrusion 79 has entered by a predetermined contracting amount. By means of this, the applied stopper force prevents further contraction of the spring portion 75. As a result, the spring portion 75 no longer contracts in excess of the predetermined contracting amount. This makes it possible to prevent failure of plastic deformation of the spring portion 75 to the level over the elastically deformable range.

In this case, the spring portion 75 integrated with the first contact portion 71 is connected to the second contact portion 81 at the upper end of the spring portion 75, and each of wave shape portions 76 of the spring portion 75 comes into contact each other when the spring portion 75 is compressed. As a result, the first contact 71 can be connected to the second contact portion 81 in an electrically short distance, and the wiring board 1 and the IC package 2 can be electrically connected in a small electric resistance value as well as the connection by the insert portion 85 described previously.

Thus, the contact pin 60 according to Embodiment is formed by two parts of the first member portion 70 and the second member portion 80, thereby the number of parts used in the contact pin 60 can be decreased. Further, the insert portion 85 of the second member portion 80 is inserted into the spring portion 75 of the first member portion 70 and the first member portion 70 and the second member portion 80 are electrically connected, thereby the distance of the electric current passing from the first contact portion 71 to the second contact portion 81 can be shortened than a conventional electric contact in which the electric current passes through the whole of the spring portion and reaches to the second electric component from the first electric component. As a result, the electric resistance value of the contact pin 60 can be lowered.

Further, in the contact pin 60 according to Embodiment, the insert portion 85 inserted into the spring portion 75 contacts the first contact portion 71, thereby the passing distance of the electric current can be shorted than in the case in which the insert portion 85 contacts only the spring portion. As a result, the electric resistance of the contact pin 60 can be further lowered.

Further, the IC package 10 according to Embodiment has the contact pin 60 described previously, thereby the IC package 10 can realize that the number of parts used in the contact pin 60 is decreased than a conventional one. The IC package 10 is provided with the contact pin 60, thereby the distance of the electric current passing from the wiring board 1 contacting the first contact portion 71 to the IC package 2 contacting the second contact portion 81 can be shortened than a conventional electric contact and the electric resistance value of the contact pin 60 can be lowered.

"Electric contact" in the present invention is not limited to the contact pin 60 described in Embodiment but others having different structure may also be applied. In Embodiment, "socket for electric component" has been applied to the IC socket 10 provided with the cover member and the operation member. However, "socket for electric component" is not limited to this and it may be applied to an IC socket having not a cover member or the like and any other device other than an IC socket.

REFERENCE SIGNS LIST 1 wiring board (first electric component)
2 IC package (second electric component)
10 IC socket (socket for electric component)
20 socket body
40 floating plate (housing portion)
60 contact pin (electric contact)
70 first member portion
70A electric conductive material member
70B plate shape member
70C wave shape member
71 first contact portion
75 spring portion
80 second member portion
81 second contact portion
85 insert portion
L axis

The invention claimed is:
1. An electric contact comprising:
a first member portion having a tubular shape and formed of an electrically conductive material, and including
a first contact portion, and
wave shaped portions forming a spring portion of the first member portion; and
a second member portion, which is a different body than the first member portion, having a rod shape and including
a second contact portion, and
an insert portion inserted into the spring portion, and being slidable so that the first member portion and the second member portion are extendable and contractable with respect to each other,
wherein the electric contact is positionable between a first electric component and a second electric component with the spring portion being contracted so that an urging force of the spring portion urges the first contact portion and the second contact portion to separate from each other, and thereby causes the first contact portion to contact the first electric component and the second contact portion to contact the second electric component with sufficient contact pressures to establish elec- trical contact between the first electric component and the second electric component.

2. The electric contact according to claim 1, wherein, when the electric contact is positioned between the first electric component and the second electric component with the spring being contracted so that the urging force of the spring portion urges the first contact portion and the second contact portion to separate from each other, the insert portion contacts the first contact portion.

3. A socket comprising:
a socket body; and
the electric contact according to claim 1, disposed in the socket body,
wherein the socket body is positionable on the first electric component, and includes a housing portion to accommodate the second electric component so that, when the socket body is positioned on the first electric component and the second electric component is accommodated in the housing portion, the electric contact is positioned between the first electric component and the second electric component.

4. A socket comprising:
a socket body; and
the electric contact according to claim 2, disposed in the socket body,
wherein the socket body is positionable on the first electric component, and includes a housing portion to accommodate the second electric component so that, when the socket body is positioned on the first electric component and the second electric component is accommodated in the housing portion, the electric contact is positioned between the first electric component and the second electric component.

5. The electric contact according to claim 1, wherein
the first contact portion has a first tip portion configured to contact the first electric component and an inserted portion formed adjacent with the first tip portion at an end of the spring portion, and
the insert portion of the second member portion is slidablly inserted in the inserted portion of the first contact portion.

6. The electric contact according to claim 1, wherein
the spring portion includes confronting recess portions corresponding to the wave shaped portions, respectively, and
each of the wave shaped portions has a convex portion, and a protrusion portion formed at a top of the convex portion and protruding in a direction orthogonal to a longitudinal axis of the electrical contact to enter into the corresponding confronting recess portion.

7. The socket according to claim 4, wherein
the spring portion includes confronting recess portions corresponding to the wave shaped portions, respectively, and
each of the wave shaped portions has a convex portion, and a protrusion portion formed at a top of the convex portion and protruding in a direction orthogonal to a longitudinal axis of the electrical contact to enter into the corresponding confronting recess portion.

8. The socket according to claim 4, wherein
the first contact portion has a first tip portion configured to contact the first electric component and an inserted portion formed adjacent with the first tip portion at an end of the spring portion, and
the insert portion of the second member portion is slidablly inserted in the inserted portion of the first contact portion.

* * * * *

UNITED STATES PATENT AND TRADEMARK OFFICE
CERTIFICATE OF CORRECTION

PATENT NO. : 10,797,423 B2
APPLICATION NO. : 16/470891
DATED : October 6, 2020
INVENTOR(S) : Osamu Hachuda Page 1 of 1

It is certified that error appears in the above-identified patent and that said Letters Patent is hereby corrected as shown below:

In the Claims

Column 10, Lines 6-7, In Claim 5, delete "slidablly" and insert -- slidably --, therefor.

Column 10, Lines 32-33, In Claim 8, delete "slidablly" and insert -- slidably --, therefor.

Signed and Sealed this
Twenty-second Day of December, 2020

Andrei Iancu
*Director of the United States Patent and Trademark Office*